(12) United States Patent
Holland

(10) Patent No.: US 9,219,877 B2
(45) Date of Patent: Dec. 22, 2015

(54) IMPEDANCE COMPENSATION CIRCUIT

(71) Applicant: Michael Holland, Santa Barbara, CA (US)

(72) Inventor: Michael Holland, Santa Barbara, CA (US)

(73) Assignee: Holland Electronics, LLC, Ventura, CA (US)

( * ) Notice: Subject to any disclaimer, the term of this patent is extended or adjusted under 35 U.S.C. 154(b) by 181 days.

(21) Appl. No.: 13/787,805

(22) Filed: Mar. 7, 2013

(65) Prior Publication Data
US 2014/0253259 A1    Sep. 11, 2014

(51) Int. Cl.
*H01P 5/12*     (2006.01)
*H04N 7/10*     (2006.01)
*H03H 7/40*     (2006.01)

(52) U.S. Cl.
CPC ........ *H04N 7/104* (2013.01); *H03H 7/40* (2013.01)

(58) Field of Classification Search
CPC ........... H03H 7/38; H03H 7/383; H03H 7/40; H04B 1/0458
USPC .................................................... 333/32, 100
See application file for complete search history.

(56) References Cited

U.S. PATENT DOCUMENTS

| | | |
|---|---|---|
| 3,346,805 A | 10/1967 | Hekimian |
| 4,769,618 A | 9/1988 | Parish et al. |
| 5,629,653 A | 5/1997 | Stimson |
| 6,531,936 B1 | 3/2003 | Chiu et al. |
| 6,578,202 B1 | 6/2003 | Holland |
| 7,646,264 B2 | 1/2010 | Petrovic |
| 7,974,586 B2 | 7/2011 | Romerein et al. |
| 2006/0015921 A1 | 1/2006 | Vaughan |

*Primary Examiner* — Robert Pascal
*Assistant Examiner* — Kimberly Glenn
(74) *Attorney, Agent, or Firm* — Paul D. Chancellar; Ocean Law

(57) ABSTRACT

The present invention provides an adjustable radio frequency ("RF") impedance method. Embodiments of the invention provide voltage adjustable RF impedance termination methods.

11 Claims, 7 Drawing Sheets

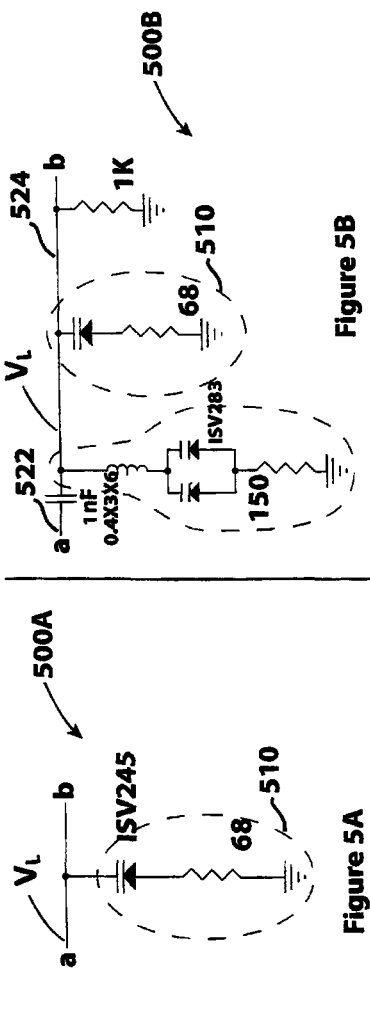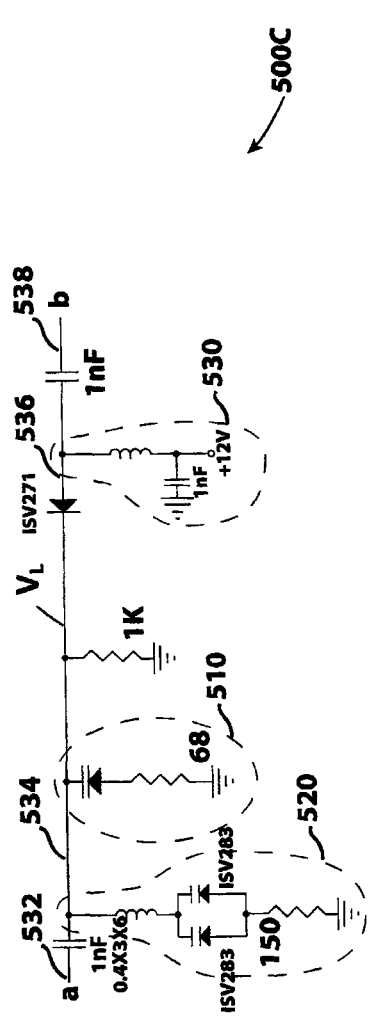
Figure 5A
Figure 5B
Figure 5C

IMPEDANCE COMPENSATION CIRCUIT

BACKGROUND OF THE INVENTION

1. Field of the Invention

The present invention relates to an article of manufacture. In particular, electronic circuits provide radio frequency signal processing means.

2. Discussion of the Related Art

Cable television services are delivered to the home typically via a single cable that connects to a power divider such as a cable television signal splitter for sharing the CATV service with multiple rooms in the home. The need to serve multiple locations leads to use of the splitter and with it an amplifier to boost the CATV signal before it is divided. Notably, externally powered amplifiers cease to operate when there is a power outage unless there is a source of backup power. Packages or "boxes" that contain the splitter and the amplifier are sometimes referred to as CATV "drop amps."

With the advent of voice over internet protocol ("VOIP") telephony, drop amp modifications have included the addition of an input splitter that divides out a VOIP port before the signal is split for CATV use in the home. This segregation of the VOIP port enables VOIP service to continue irrespective of whether there is a power outage affecting the drop amp amplifier.

In order for the VOIP signals to be delivered to the home correctly, the input splitter needs to maintain a high return loss (low reflection coefficient) in the situation when the amplifier is not powered. Most CATV amplifiers are designed to have a high input return loss over 18 dB when DC power is on which results in low reflections of the signal. This 18 dB return loss relates to an impedance of about 75 ohms+/−3 ohms when the amp is powered but becomes a poor return loss of 8-10 dB when power is removed. The problem exists in the design of commonly used Wilkinson hybrid splitters where the input return loss can only be high if the output ports also have a proper impedance termination. If the splitter output port return loss feeding the amplifier goes low, so does the input to the splitter and thus unacceptable system operation. An acceptable splitter input return loss needs to be in the 18 dB range for proper VOIP operation and thus, due to the hybrid splitter design, one output may have a termination between 60-90 ohms to insure the splitter input return loss is high enough. To resolve this problem of a power outage reducing the input splitter return loss, a circuit needs to be located, for example between the splitter output port and amplifier input port, to maintain a constant impedance to the splitter port despite amplifier impedance changes. The problem becomes difficult to solve as the needed impedance adjustment is required as power is removed thus making it difficult to effect a change.

Prior art teaches impedance matching requires either an active detection and adjustment circuit, a mechanical relay in the energized state to release and insert a new termination with loss or power, or a radio frequency ("RF") MOSFET switch that can have a low RF insertion loss with no power and a high insertion loss with power.

Prior art U.S. Pat. No. 5,629,653 teaches an active circuit to detect and adjust a variable capacitor to adjust the load. Prior art U.S. Pat. No. 6,531,936 teaches the use of a varactor diode as the adjustable tuning element fed by an active detector. Prior art U.S. Pat. No. 4,769,618 shows the use of a MOSFET switch to switch in loads as needed to effect a constant termination in varying conditions.

Prior art U.S. Pat. No. 7,974,586 teaches a mechanical relay that when de-energized switches from an amplifier connection to a 75 ohm resistor to ground. As skilled artisans will recognize, reliance on mechanical devices leads to reliability problems. Another known switching method noted in the '586 patent is use of an RF MOSFET (as also used in U.S. Pat. No. 4,769,618) to selectively switch to a 75 ohm load when system power is removed. Substituting a mechanical switch for an electronic switch improves reliability but it also increases cost.

FIG. 1 shows a prior art drop amp without a segregated VOIP port 100. Here, a drop amp case 101 has multiple ports including a CATV input port 102, CATV output ports 112, and an external power supply connection 113. Inside the case, a filter block 114 provides for frequency multiplexing, a feature that enables a feed cable 130 from the cable system 132 and an output cable 140 to a home appliance 142 such as a television to transport signals bidirectionally.

Frequency multiplexing is provided by a filter block input diplexer 116 and a filter block output diplexer 126. The input diplexer includes a high frequency filter 160 transferring signals to a high frequency filter 162 of the output diplexer. The output diplexer includes a low frequency filter 152 transferring signals to a low frequency filter of the input diplexer 150.

An input signal line 104 interconnects the input port 102 with the input diplexer while output signal lines 110 extend between respective output ports 112 and an output splitter 108. A filter output line 106 interconnects the output diplexer 126 and the filter output splitter.

Between the input and output diplexers 116, 126, high and low frequency signals 163, 153 are transported on high and low frequency channels. In CATV systems, the high frequency channel is typically the frequency band 54-102 MHz transporting CATV program content while the low frequency channel is typically the frequency band 5-42 MHz transporting home originated content such as user instructions directed to the CATV system.

Within the filter block, the input diplexer 116 demultiplexes the incoming CATV program signal 163 from the signals at the drop amp input 102 and multiplexes the outgoing home originated signal 153 with the signals at the input. As shown, the high frequency signal 163 is transported to an amplifier 120 by amplifier input line 122 and from the amplifier to the output diplexer 126 by an amplifier output signal line 123. And, as shown, an amplifier is typically used in the high frequency channel and not in the low frequency channel. Explanations for this may include increased attenuation of high frequency signals and local origination/stronger signal of the low frequency signal.

Also within the filter block, the output diplexer 126 multiplexes the amplified incoming signal 163 with the signals at the filter output line 106 and demultiplexes the home originated signal 153 from the filter output line. As shown, the low frequency signal 153 is transported to the input diplexer 116 via a low frequency line 118.

FIG. 2 shows a prior art drop amp including a segregated port such as a VOIP port 200. Here, an input power divider such as a directional coupler 204 divides the input signal to provide the segregated or VOIP port 210.

The input splitter 204 interconnects with the drop amp input port 102 via an input signal line 202. Splitter divided signal lines 206, 208 interconnect with the filter block input diplexer 116 and with a segregated port 210. The segregated port provides bidirectional signal transport such as voice signals originating in the home 213 (transmitted voice) and voice signals originating outside the home 212 (received voice).

The drop amp of FIG. 2 provides VOIP service that does not rely on power provided to the drop amp by the external power supply 103. This feature recognizes the need to maintain certain services, such as telephone service, even when there is a power outage. However, this drop amp configuration creates an out of specification impedance problem for cable television distribution systems. The problem appears when the drop amp amplifier loses power and changes impedance as a consequence. For example, an operating amplifier with a nominal 75 ohm input impedance undergoes an impedance change such as an impedance increase and return loss "dip" when power is lost.

Such a return loss dip increases the strength of reflected signals and, among other things, impairs VOIP service. CATV operators therefore require that loads connected to the CATV distribution system, such as drop amplifiers, maintain a nominal 75 ohm input impedance.

Various solutions to the return loss "dip" problem associated with power loss to drop amps have been designed. Typical of these prior art solutions is the circuitry found in U.S. Pat. No. 7,974,586 to Romerein et al. (the "'586 patent") included herein by references in its entirety and for all purposes.

FIG. 4 of the '586 patent, shown here as FIG. 3A, depicts a relay switched solution to the return loss dip problem. Here, a relay selectively interconnects the non-VOIP directional coupler output with either of the filter block input or with ground via a resistor 206, for example a nominal 75 ohm resistor. Operating the relay to interconnect the coupler output to ground when there is a power outage (as shown, contacts 209 open and 210 closed) and operating the relay to interconnect the coupler output to the filter block input when power is available (not shown, contacts 209 closed and 210 open) provides a fix for the return loss dip problem.

FIG. 8 of the '586 patent shown here as FIG. 3B depicts an electronic switched solution to the return loss dip problem. Here, a solid-state switching circuit 230 that is equivalent to an electromechanical single-pole-double-throw relay is connected between diplex filter 204 and the input of amplifier 216. The manner of operation follows. Whenever power is applied to amplifier 216, it is also applied to input terminal 218, of the solid-state switching circuit 230, causing the pin diode 254 to pass RF signals from bypass capacitor 244 through bypass capacitor 258 to the input of amplifier 216. Also, when power is applied to amplifier 216 in the solid-state switching circuit 230, MOSFET switch 108 is turned off, electrically disconnecting resistor 252 from input terminal 231. When power is lost or dropped out from amplifier 216, it is also removed from power terminal 218 of the solid-state switch 230, causing the pin diode 254 to become backbiased, preventing signal flow from diplex filter 204 through the solid-state switch 230 to the amplifier 216. Also, as previously discussed, when power is lost, MOSFET switch 108 operates to lower the resistance of its main current path for effectively connecting resistor 252 between input terminal 231 and ground. (Col. 7, ll 44-60)

When power is lost, this switched solution interconnects the input diplexer high frequency connection with a resistor to ground. When power is available, the switch interconnects the input diplexer high frequency connection with the amplifier input.

SUMMARY OF THE INVENTION

The present invention provides variable impedance devices and applications using these variable impedance devices. Various embodiments of the variable impedance devices include one or more varactor controlled circuits.

A typical application places a variable impedance device of the present invention between a selected output port of a Wilkinson type splitter (75 ohm hybrid RF power divider-splitter-combiner) and the input of an amplifier or prior filter circuit/device. This configuration provides a means to control the impedance at the splitter output port despite impedance variations downstream of the variable impedance device. Impedance control at the selected splitter output port enables management of splitter input impedance and with it device return loss. Notably, such impedance control actions provide a means to compensate for impedance changes in an amplifier downstream of the variable impedance device when for example power to the amplifier is lost during a power outage.

References herein to Wilkinson type splitters refer to splitters that benefit from the present invention such as Wilkinson 75 ohm hybrid RF splitters. Hybrid RF splitters long used in the television and satellite applications benefit from the present invention. These splitters incorporate a 2-stage modified Wilkinson design having a first stage with a 75 ohm input (Zin) converted to one half of Zin or 37.5 ohms. A second stage consists of a transformer converting the 37.5 ohms to a pair of 75 ohm equal outputs. The design includes a balancing resistor isolating the output ports. In various embodiments, 2 stage splitters provide output ports with impedances matched to 75 ohms to achieve the low insertion loss and high port-to-port isolation. Exemplary splitters utilize a balancing resistor, inductors and capacitors to maintain a complex impedance (see U.S. Pat. No. 6,578,202 to Holland which is incorporated, in its entirety and for all purposes, herein). Some embodiments are configured to function as directional couplers.

Impedance control at the selected splitter output is provided in various embodiments. This is accomplished by compensating for a first variable impedance (the amplifier) with a second parallel connected variable impedance, the variable impedance device of the present invention.

Embodiments of the present invention provide variable impedance devices in the form of shunts. Locating such a shunt or shunt load between a) the RF center conductor at the splitter output and b) ground provides the second parallel connected variable impedance. Reduced shunt impedance on the splitter output when DC power to the amplifier is lost can be used to control splitter input impedance to a nominal value of about 75 ohms which provides approximate nominal 75 ohm splitter input or termination impedance. Use of a varactor diode enables this shunt insertion loss variation as further explained below.

When a 2-way Wilkinson-type splitter is used, maintaining an input return loss over 18 dB requires only an approximate 75 ohm termination (in the range of 60-90 ohms) at one output port (the amplifier fed port) if the other output port has a true 75 ohm termination.

The capacitance of a varactor diode varies inversely with DC biasing voltage. Capacitance is relatively high with no or low DC biasing and capacitance decreases as the DC biasing voltage increases. In particular, when reverse biased by a DC power source, a varactor diode has a relatively low capacitance and corresponding low insertion loss. But, when the biasing voltage falls or is lost, the varactor diode capacitance increases and a corresponding high insertion loss like that of a shunt results.

As the varactor undergoes capacitance changes related to reverse bias voltage, the slope of the resultant insertion loss can be managed to improve performance unless a frequency sloped termination is desired. Embodiments manage the slope of the insertion loss using a variable impedance device with multiple varactor diodes. These embodiments include related passive components and compensate for the varying termination impedance of the amplifier.

BRIEF DESCRIPTION OF THE DRAWINGS

The present invention is described with reference to the accompanying figures. These figures, incorporated herein and forming part of the specification, illustrate embodiments of the invention and, together with the description, further serve to explain its principles enabling a person skilled in the relevant art to make and use the invention.

FIGS. 5A-C are circuit schematics showing variable impedance circuits used with the variable impedance device of FIG. 4.

DESCRIPTION OF THE PREFERRED EMBODIMENTS

Figure 1:
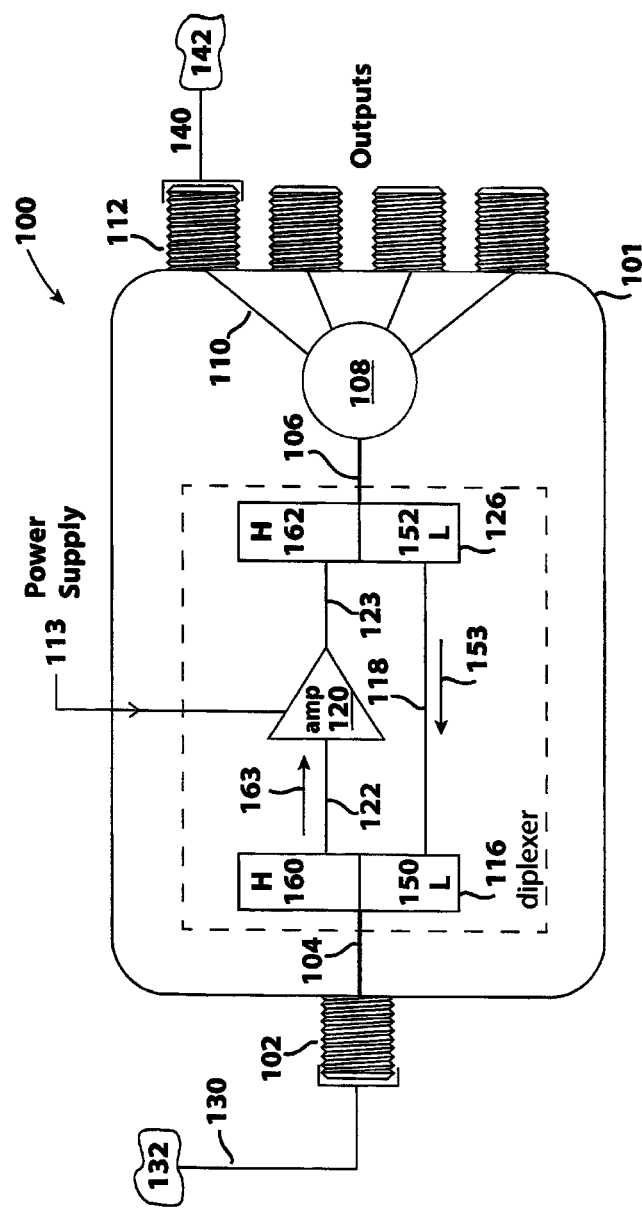
FIG. 1 shows a prior art drop amplifier without a VOIP port.
Figure 2:
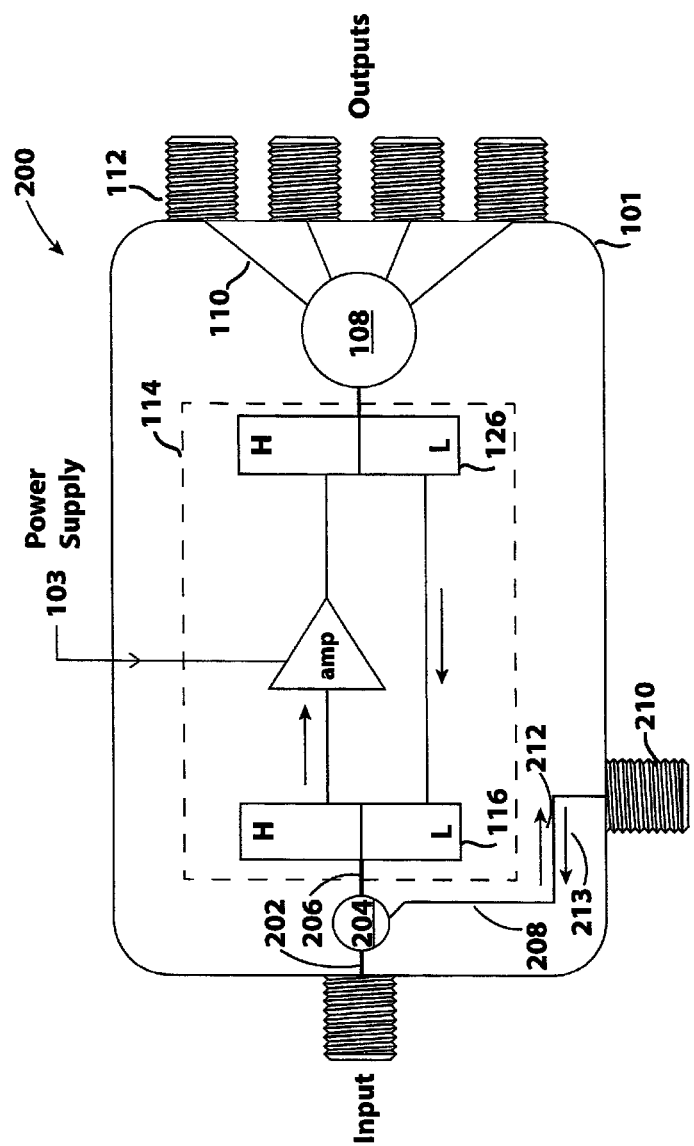
FIG. 2 shows a prior art drop amplifier with a VOIP port.
Figure 3A:
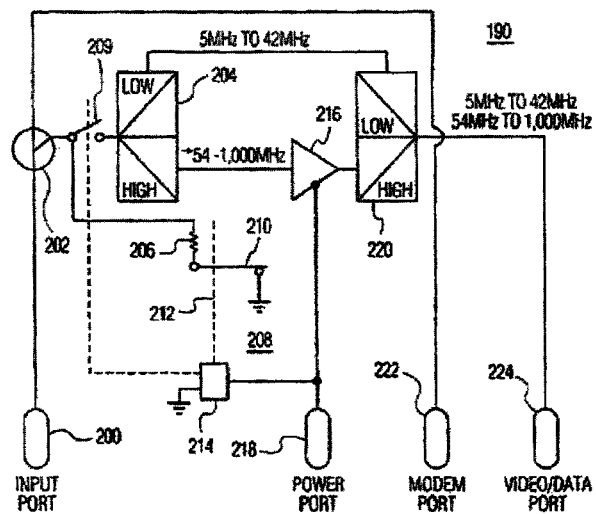
FIG. 3A shows prior art drop amplifier circuit with a relay switch.
Figure 3B:
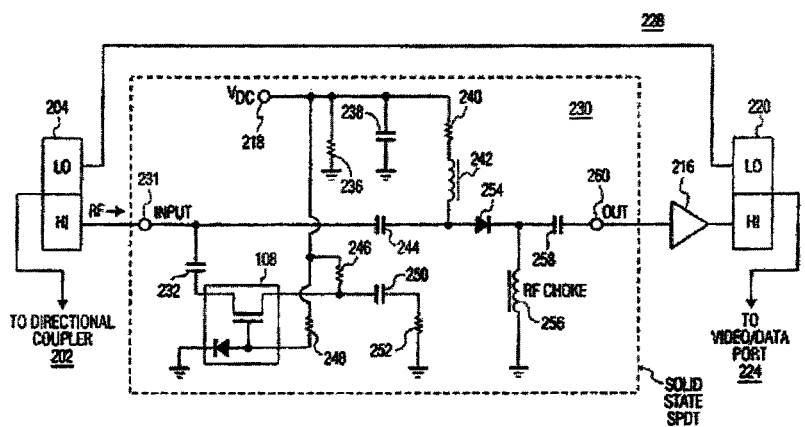
FIG. 3B shows a prior art drop amplifier circuit with an electronic switch.
Figure 4:
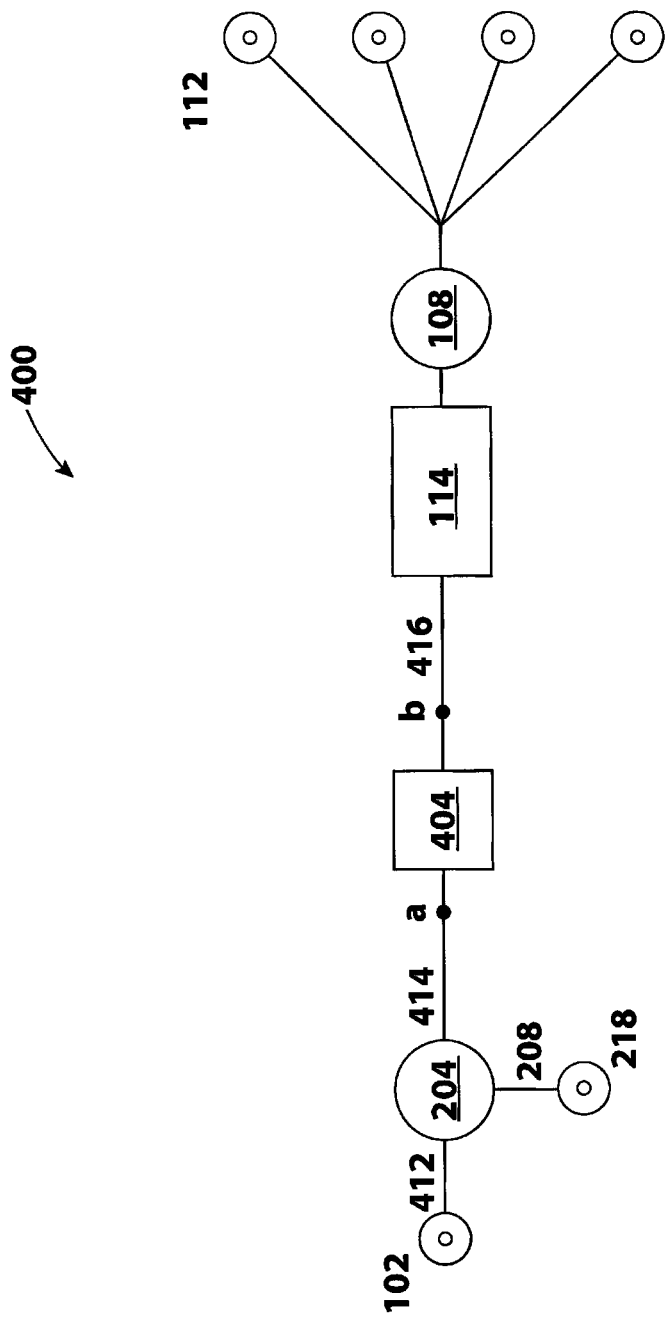
FIG. 4 shows a drop amplifier including a variable impedance device of the present invention.

FIG. 4 shows a drop amp in accordance with the present invention 400. Unlike the prior art series switch on an input diplexer input or the prior art electronic switch between the amplifier and the input diplexer high frequency output, the present invention utilizes embodiments of a variable impedance device 404 to compensate for drop amp input impedance when there is a power outage and amplifier impedance change. As shown, the variable impedance device 404 is located in line (connects between points "a" and "b") between the directional coupler 204 and the filter block 114. A first line 412 interconnects the input port 102 and the directional coupler, a second line 414 interconnects the directional coupler and the variable impedance device 404, and a third line 416 interconnects the variable impedance device and the input diplexer.

FIGS. 5A-5C show variable impedance circuits 500A, 500B, 500C for use with the present invention. As seen, each of these circuits includes one or more varactor diodes that provide a voltage controlled, variable impedance path(s) to ground. In particular, varactor diode capacitance is proportional to or equals to the inverse of the square root of the voltage across the diode ($C=(1/(SQRT(V))$.

FIG. 5A shows a single stage variable impedance circuit 500A. In particular, the cathode of a varactor diode connects with drop amp circuit points "a" and "b" while a resistor connected between the diode anode and ground completes the circuit to ground. This series circuit therefore provides a voltage controlled path to ground or a voltage controlled shunt.

In operation, the shunt impedance varies with the applied DC voltage $V_L$. In particular, when $V_L$ drops as in a power outage, varactor diode capacitance increases and signals of sufficient frequency that are present at the diode's cathode are shunted to ground via the resistor.

This high to low impedance transition following a loss of DC voltage therefore provides compensating impedance in parallel with the amplifier 120 impedance. In CATV drop amps, the desired input impedance is 75 ohms and the compensating impedance will be selected with this in mind. For example, a suitable varactor diode for this application is the ISV245 device used with a series resistor of about 68 ohms. As skilled artisans will recognize, shunt resistance can approach 75 ohms to compensate for an amplifier with relatively high power-out impedance. And, as skilled artisans will recognize, variations on applicant's single stage varactor shunt may be employed with similar results.

FIG. 5B shows a dual stage shunt 500B. The dual stage shunt includes high and low frequency shunts in parallel. A first line segment 522 extends between circuit point "a" and an RF bypass capacitor and a second line segment 524 extends between circuit point "b" and the RF bypass capacitor. Three circuits extend between the second line segment and ground.

The first circuit extending between the second line segment and ground is a low frequency shunt 520. This low frequency shunt includes one or more varactor diodes. In an embodiment, the low frequency shunt uses two ISV283 varactor diodes in parallel with anodes connected to ground via a 150 ohm resistor and cathodes connected to the second line segment by an inductor (0.4×3×6).

The second circuit extending between the second line segment and ground is a high frequency shunt 510. This high frequency shunt is like the shunt of FIG. 5A.

The third circuit extending between the second line and ground is a current sink. Here, a resistor such as a 1 kilo (K) ohm resistor provides a current path between the second line segment and ground. As skilled artisans will recognize, variations on applicant's dual stage varactor shunt may be employed with similar results.

FIG. 5C shows an improved performance dual stage shunt 500C. This dual stage shunt includes high and low frequency shunts in parallel. A first line segment 532 extends between circuit point "a" and a first RF bypass capacitor and a second line segment 534 extends between this capacitor and the cathode of a blocking diode such as an ISV271 device. A third line segment 536 extends between the diode anode and a second blocking capacitor. A fourth line segment 538 extends between circuit point "b" and this capacitor.

Three circuits extend between the second line segment 534 and ground. The first two circuits are low frequency 520 and high frequency 510 shunts like those of FIG. 5B and the third is a current sink using a 1 kilo ohm resistor like that of FIG. 5B.

A fourth circuit extends between the third line segment and ground. This circuit 530 provides a DC voltage to bias the blocking diode. A first terminal of a two terminal inductor is connected to the third line segment and the second terminal is connected to a DC power source such as a 12 Volt DC power source. An RF bypass diode to ground is connected to the inductor second terminal. As skilled artisans will recognize, variations on applicant's improved performance dual stage varactor shunt may be employed with similar results.

Figure 6:
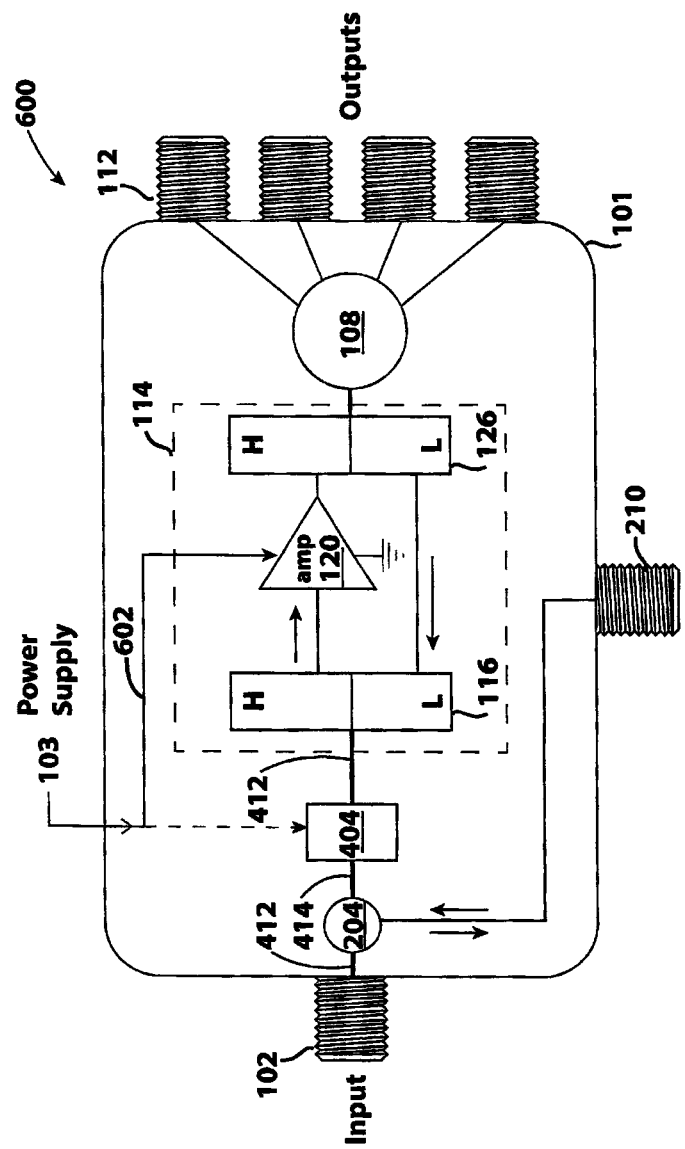
FIG. 6 shows a drop amp including a variable impedance device of FIG. 4.

FIG. 6 shows a drop amp fitted with a variable impedance circuit of the present invention 600. As shown, the external power supply supplies power to the filter block amplifier 120 via a first power supply line 602 and optionally to the variable impedance circuit 404 via a second power supply line. As seen in FIG. 5C above, the optional power supply provides power to the variable impedance circuit of the dual stage shunt with improved performance.

Figure 7:
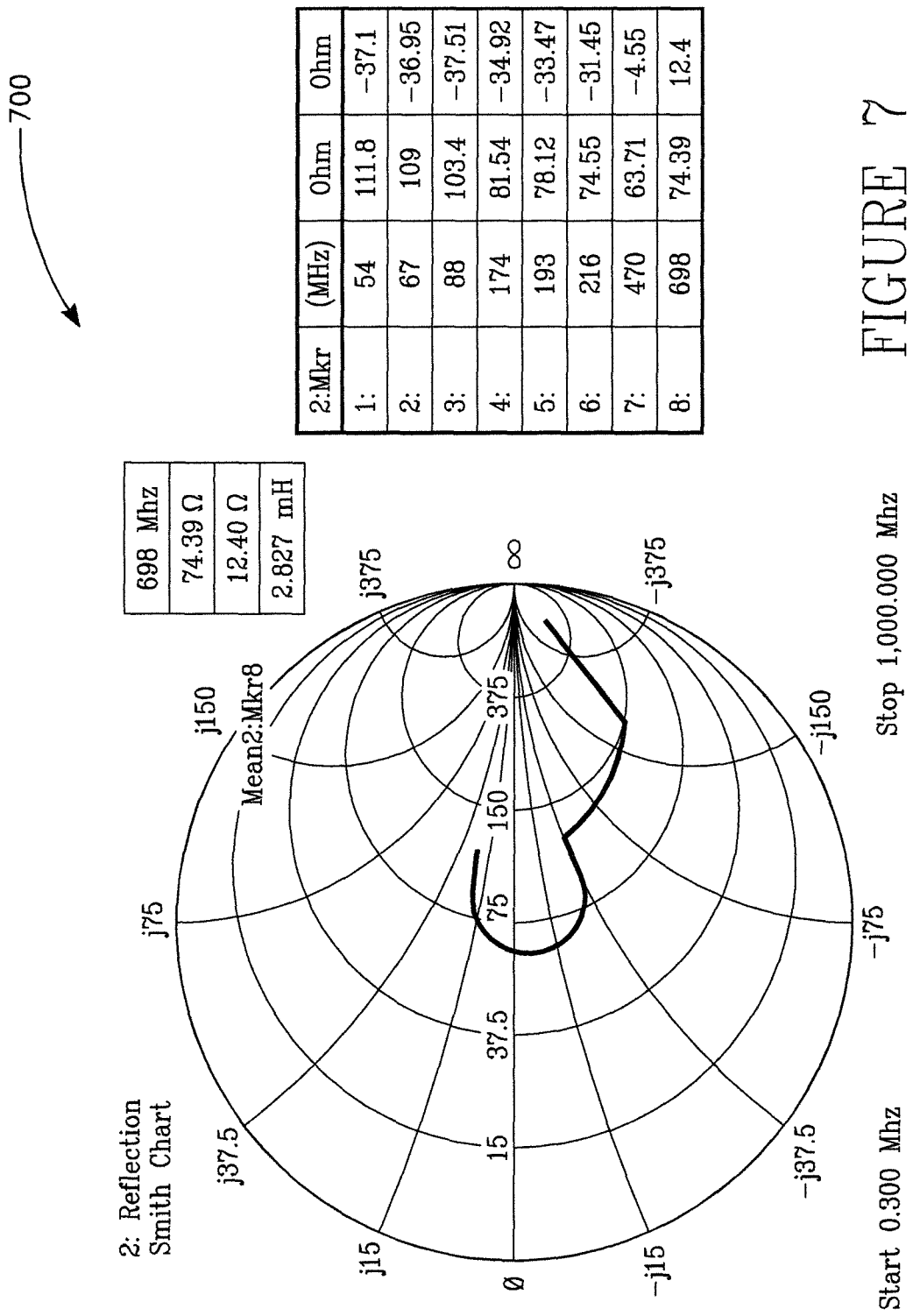
FIG. 7 shows a Smith chart for a variable impedance device of FIG. 4.

Illustrative of operation of a high frequency shunt is the Smith chart 700 of FIG. 7. The chart shows a selection of varactor shunt and series circuit elements that provide compensating impedance over the required frequency range. In some embodiments, the varactor shunt circuits are directly connected to the amplifier load and in some embodiments, a back-biased diode isolates the amplifier load. This may be required where applications have the amplifier directly connected to the splitter output and in some applications where the amplifier is separated from the input splitter by a diplex filter requiring some isolation.

While various embodiments of the present invention have been described above, it should be understood that they have been presented by way of example only, and not limitation. It will be apparent to those skilled in the art that various changes in the form and details can be made without departing from the spirit and scope of the invention. As such, the breadth and scope of the present invention should not be limited by the above-described exemplary embodiments, but should be defined only in accordance with the following claims and equivalents thereof.

What is claimed is:

1. A radio frequency apparatus comprising:
   a signal input and a signal output;
   a first variable impedance device loading the signal input;
   a second variable impedance device including a variable capacitor with capacitance varying inversely with an applied voltage; and,
   the second variable impedance device configured to compensate for variations in impedance at the signal input caused by the first variable impedance.

2. The radio frequency apparatus of claim 1 further comprising:
   a Wilkinson 75 ohm hybrid splitter with a splitter input wherein the signal input is the splitter input;
   a first splitter output is loaded by the first and second variable impedances; and,
   a second splitter output is loaded by a nominal 75 ohm impedance.

3. The radio frequency apparatus of claim 2 further comprising:
   a varactor diode configured to provide the variable capacitor of the second variable impedance device.

4. The radio frequency apparatus of claim 3 further comprising:
   an externally powered amplifier that includes the first variable impedance device; and,
   wherein a tendency of the signal input impedance to change during an amplifier power outage is reduced by a corresponding change of the impedance of the varactor diode.

5. A radio frequency device comprising:
   a two way power divider with an input and first and second outputs;
   the power divider input for connecting to a cable television distribution system;
   a varactor diode shunt circuit extending between the power divider first output and a ground; and,
   the varactor shunt circuit configured to compensate for downstream impedance changes tending to vary an impedance at the power divider input.

6. The radio frequency device of claim 5 further comprising:
   the varactor diode shunt circuit interconnecting with a filter block;
   the filter block including input and output diplexers with high and low frequency signal paths therebetween; and,
   the high frequency signal path including an amplifier for amplifying signals derived from the power divider first output signals.

7. The radio frequency device of claim 6 further comprising:
   an external power supply for supplying DC voltage to the amplifier;
   wherein, an external power supply power outage causes the amplifier input impedance to change; and,
   wherein an amplifier impedance change is compensated for by action of the varactor diode shunt circuit.

8. The radio frequency device of claim 7 further comprising:
   a low frequency varactor shunt in the varactor diode shunt circuit; and,
   a high frequency varactor shunt in the varactor diode shunt circuit.

9. The radio frequency device of claim 8 further comprising:
   the varactor diode shunt circuit isolated from a splitter by a first RF bypass capacitor;
   the varactor diode shunt circuit isolated from the filter block by a second RF bypass capacitor; and,
   a blocking diode interposed between the RF bypass capacitors, the diode cathode interconnecting with the first RF bypass capacitor.

10. The radio frequency device of claim 9 wherein the an external power supply outage results in a varactor bias voltage decrease of at least 6 volts and a corresponding varactor diode shunt capacitance at least 6 times greater than varactor diode shunt capacitance before the outage.

11. A radio frequency apparatus comprising:
    a signal input and one or more signal outputs;
    a first variable impedance source within the radio frequency device loading the signal input;
    a second voltage-controlled variable impedance device having a capacitance varying inversely with an applied voltage; and,
    the second variable impedance device compensating for variations in impedance at the signal input caused by the first variable impedance source.

* * * * *